United States Patent
Lee et al.

(10) Patent No.: US 9,806,709 B2
(45) Date of Patent: Oct. 31, 2017

(54) GATE DRIVER FOR DRIVING INVERTER

(71) Applicant: LSIS CO., LTD., Gyeonggi-do (KR)

(72) Inventors: Jae-Moon Lee, Gyeonggi-do (KR); Chun-Suk Yang, Gyeonggi-do (KR)

(73) Assignee: LSIS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/098,252

(22) Filed: Apr. 13, 2016

(65) Prior Publication Data

US 2016/0308530 A1    Oct. 20, 2016

(30) Foreign Application Priority Data

Apr. 14, 2015   (KR) .................. 10-2015-0052597

(51) Int. Cl.
| | | |
|---|---|---|
| *H03K 3/00* | (2006.01) | |
| *H03K 17/687* | (2006.01) | |
| *H02M 1/08* | (2006.01) | |
| *H02M 1/32* | (2007.01) | |
| *H02M 1/36* | (2007.01) | |
| *H02M 1/00* | (2006.01) | |

(52) U.S. Cl.
CPC .......... *H03K 17/6871* (2013.01); *H02M 1/08* (2013.01); *H02M 1/32* (2013.01); *H02M 1/36* (2013.01); *H02M 2001/0006* (2013.01)

(58) Field of Classification Search
None
See application file for complete search history.

(56) References Cited

U.S. PATENT DOCUMENTS

| 6,297,615 B1 | 10/2001 | Crass | |
|---|---|---|---|
| 7,697,309 B2 * | 4/2010 | Bao .................. | H02M 1/32 361/91.6 |
| 8,103,885 B2 * | 1/2012 | Sawyers ............ | G06F 1/26 307/149 |
| 2008/0284377 A1 | 11/2008 | Chen et al. | |

(Continued)

FOREIGN PATENT DOCUMENTS

| JP | 01270733 A | 10/1989 |
|---|---|---|
| JP | 2014-197944 A | 10/2014 |

(Continued)

OTHER PUBLICATIONS

Extended European Search Report for Application No. 16162602.3 dated Aug. 5, 2016, in 8 pages.

(Continued)

*Primary Examiner* — Lincoln Donovan
*Assistant Examiner* — Khareem E Almo
(74) *Attorney, Agent, or Firm* — Nath, Goldberg & Meyer; Jerald L. Meyer (57) ABSTRACT

The present disclosure relates to a gate driver for driving an inverter. In one embodiment, a gate driver includes an IC module configured to generate the switching signal by using a PWM signal input from the outside, and a power supply managing part configured to apply an IC module driving voltage for drive of the IC module by using a switching element and a driver driving voltage for drive of the gate driver if the driver driving voltage is equal to or larger than a first reference voltage, and is further configured to stop the application of the IC module driving voltage if the driver driving voltage is equal to or lower than a second reference voltage.

3 Claims, 8 Drawing Sheets

(56) References Cited

U.S. PATENT DOCUMENTS

| | | | | |
|---|---|---|---|---|
| 2013/0127500 A1* | 5/2013 | Kobayashi | ......... | H03K 17/0822 327/109 |
| 2014/0016361 A1* | 1/2014 | Weis | ..................... | H02M 7/217 363/21.02 |
| 2014/0233285 A1* | 8/2014 | Nishijima | ............. | H02M 7/217 363/62 |
| 2015/0003118 A1 | 1/2015 | Shin et al. | | |
| 2015/0035512 A1* | 2/2015 | Kim | ..................... | H02M 3/073 323/300 |
| 2016/0190952 A1* | 6/2016 | Lee | ..................... | H02M 1/4225 363/61 |
| 2016/0204694 A1* | 7/2016 | Kim | ..................... | H02M 7/155 363/126 |
| 2016/0308530 A1* | 10/2016 | Lee | ......................... | H02M 1/08 |
| 2016/0329808 A1* | 11/2016 | Han | ......................... | H02M 1/08 |

FOREIGN PATENT DOCUMENTS

| | | |
|---|---|---|
| JP | 2015-70698 A | 4/2015 |
| KR | 20000020844 A | 4/2000 |
| KR | 20-2000-0014874 U | 7/2000 |
| KR | 10-0902608 B1 | 6/2009 |
| KR | 10-2011-0068014 A | 6/2011 |
| KR | 10-2011-0089907 A | 8/2011 |
| KR | 10-2014-0081569 A | 7/2014 |

OTHER PUBLICATIONS

Korean Office Action issued in Application No. 10-2015-0052597 dated Jun. 15, 2016, in 5 pages.
European Office Action dated Jun. 1, 2017 in connection with the counterpart European Patent Application No. 16162602.3.
Japanese Office Action dated Apr. 18, 2017 in connection with the counterpart Japanese Patent Application.
Onsemi.com: "MC33153—Single IGBT Gate Driver", Aug. 1, 2013, p. 1-14, XP055376234.
Fairchild Semiconductor AN-9035 Smart Power Module Motion-SPM in Mini-DIP User's Guide, 2005.
KR office action dated Dec. 28, 2016 for corresponding KR application 10-2015-0052597.

* cited by examiner

GATE DRIVER FOR DRIVING INVERTER

CROSS REFERENCE TO RELATED APPLICATION

This application claims the benefit of Korean Patent Application No. 10-2015-0052597, filed on Apr. 14, 2015, which is hereby incorporated by reference in its entirety.

BACKGROUND

Technical Field

The present disclosure relates to a gate driver, in particular, a gate driver for driving an inverter.

Description of the Related Art

An inverter is a circuit for converting an AC voltage into a DC voltage, generating an AC voltage by switching a DC voltage converted according to a switching signal by means of a switching element, and outputting the generated AC voltage. Such an inverter can be used to control the drive of a load with high precision by supplying an AC voltage having magnitude and frequency desired by a user to the load.

Figure 1:
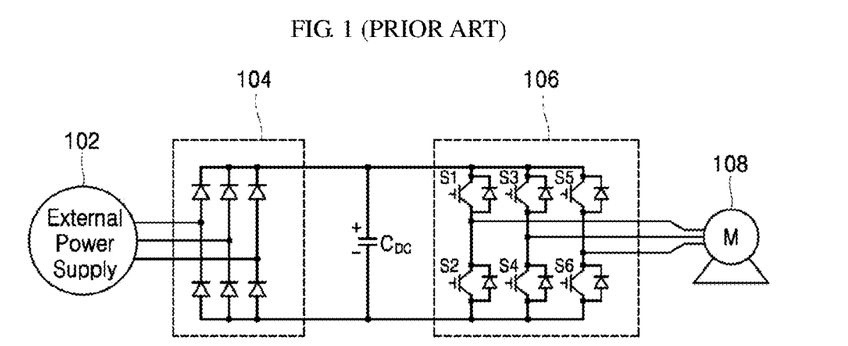
FIG. 1 shows the configuration of a general three-phase two-level inverter according to a conventional technique.

FIG. 1 shows the configuration of a general three-phase two-level inverter according to a conventional technique. Referring to FIG. 1, a rectifying part 104 of the inverter rectifies a three-phase AC voltage, which is applied from an external power supply 102, into a DC voltage. The DC voltage obtained through this rectification is smoothed by a capacitor $C_{DC}$. The smoothed DC voltage is converted into a three-phase AC current by means of a switching part 106. The three-phase AC current obtained through this conversion is input to a load such as a motor 108 and is used to drive the load.

The switching part 106 of such an inverter includes a plurality of switching elements S1 to S6. Each of pairs of switching elements (S1/S2, S3/S4 and S5/S6) generates the three-phase AC current through a complementary switching operation which is achieved by a switching signal applied by a gate driver.

Such a gate driver is started only when a driver driving voltage is externally applied to the gate driver. However, it takes a certain time for the driver driving voltage to arrive at a reference voltage appropriate for the drive of the gate driver. The existence of such reference voltage arrival time may cause malfunction of the gate driver, which may result in malfunction and damage of the plurality of switching elements S1 to S6 included in the switching part 106 shown in FIG. 1.

SUMMARY

Accordingly, it is an object of some embodiments in the present disclosure to provide a gate driver for driving an inverter, which is capable of preventing malfunction of the gate driver and malfunction and damage of a switching element, which occur for a reference voltage arrival time, by interrupting supply of power to an IC module within the gate driver until a driver driving voltage for drive of the gate driver arrives at a reference voltage appropriate for the drive of the gate driver.

It is another object of some embodiments in the present disclosure to provide a gate driver for driving an inverter, which is capable of preventing malfunction of the gate driver and malfunction and damage of a switching element, which occur due to power abnormality, by immediately interrupting supply of power to an IC module if a driver driving voltage falls below a reference voltage.

The above and/or other aspects and advantages of the present disclosure will become apparent and more readily appreciated from the following description of the embodiments, taken in conjunction with the accompanying drawings. It should be understood that the objects and advantages of the present disclosure can be realized by features and combinations thereof set forth in the claims.

To accomplish the above objects, there is provided a gate driver for generating a switching signal used to control a switching operation of an inverter, including: an integrated circuit (IC) module configured to generate the switching signal by using a pulse width modulated (PWM) signal input from the outside; and a power supply managing part configured to apply an IC module driving voltage for drive of the IC module by using a switching element and a driver driving voltage for drive of the gate driver if the driver driving voltage is equal to or larger than a first reference voltage, and is further configured to stop the application of the IC module driving voltage if the driver driving voltage is equal to or lower than a second reference voltage.

Some embodiments of the present disclosure has an advantage in that it is possible to prevent malfunction of a gate driver and malfunction and damage of a switching element, which occur for a reference voltage arrival time, by interrupting supply of power to an IC module within the gate driver until a driver driving voltage for drive of the gate driver arrives at a reference voltage appropriate for the drive of the gate driver.

Some embodiments of the present disclosure has another advantage in that it is possible to prevent malfunction of a gate driver and malfunction and damage of a switching element, which occur due to power abnormality, by immediately interrupting supply of power to an IC module if a driver driving voltage falls below a reference voltage.

DETAILED DESCRIPTION

The above objects, features and advantages will become more clearly apparent from the following detailed description in conjunction with the accompanying drawings. Therefore, the technical ideas of the present disclosure can be easily understood and practiced by those skilled in the art. In the following detailed description of the present disclosure, concrete description on related functions or constructions will be omitted if it is deemed that the functions and/or constructions may unnecessarily obscure the gist of the present disclosure. Hereinafter, preferred embodiments of the present disclosure will be described in detail with reference to the accompanying drawings. Throughout the drawings, the same or similar elements are denoted by the same reference numerals.

Figure 2:
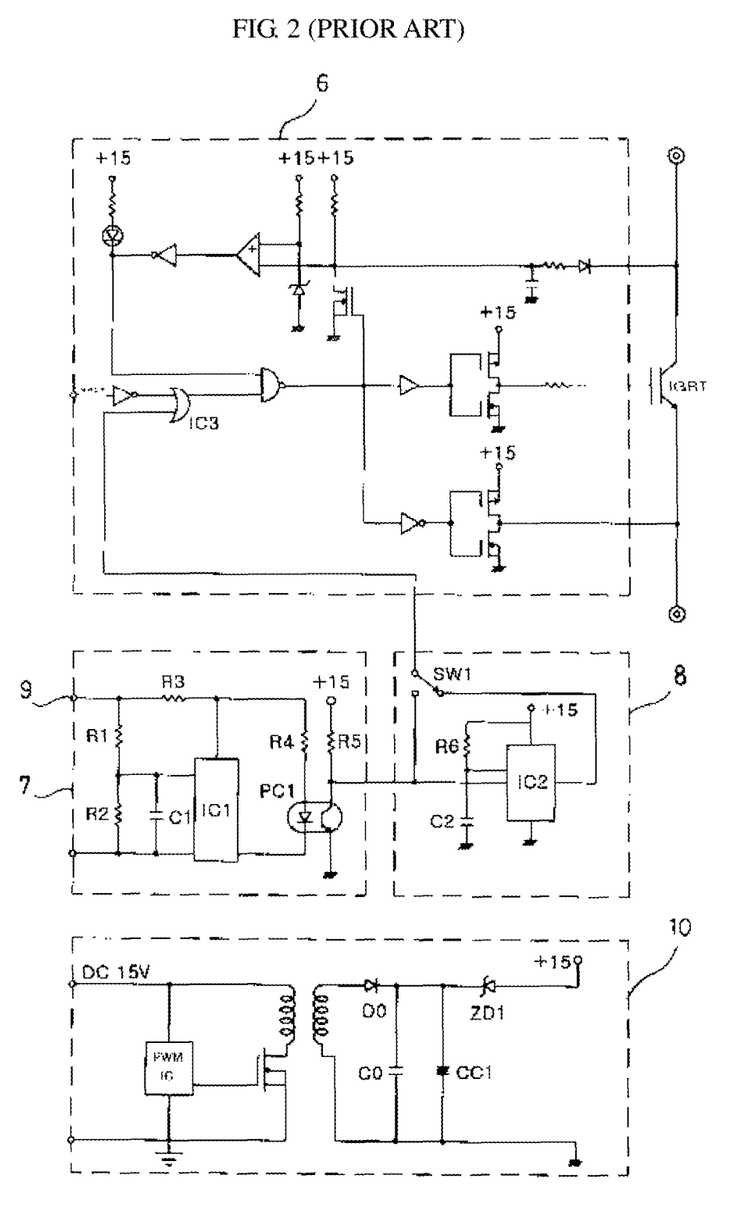
FIG. 2 is a circuit diagram for explaining how to manage a power supply of a gate driver according to a conventional technique.

FIG. 2 is a circuit diagram for explaining how to manage a power supply of a gate driver according to a conventional technique.

Referring to FIG. 2, a gate driver 6 according to the conventional technique receives driver driving power from a power supply part 10. A control power supply monitoring part 7 monitors whether or not a driver driving voltage generated by the power supply part 10 exceeds a reference voltage, through a power supply terminal 9. If it is detected that the driver driving voltage exceeds the reference voltage, the control power supply monitoring part 7 controls a switching operation of a switching element included in the gate driver through an IC module IC2 connected to a switch SW1 of a trigger part 8.

In addition, the power supply part 10 shown in FIG. 2 includes a charging capacitor CC1 for holding power to be used to maintain the gate driver in an active state for a certain time even when the control power supply 9 of the control power supply monitoring part 7 is fault or cut off, a diode DO for rectifying AC power and preventing the power held in the charging capacitor CC1 from being lost in a way other than the gate driver, a Zener diode ZD1 for preventing the gate driver from malfunctioning at a low voltage by preventing power from being applied to the gate driver if the power voltage held in the charging capacitor CC1 becomes equal to or lower than a specified voltage (for example, 13.5V), and a capacitor CO.

However, such a conventional gate driver configuration and the power supply managing method thereof have disadvantages of increase in size and production costs of the gate driver due to complicated circuit configuration and the number of additional elements.

The present disclosure aims at preventing malfunction of an IC module within a gate driver and a switching element included in an inverter by comparing a driver driving voltage for drive of the gate driver with reference voltages (first reference voltage and second reference voltage) with a simpler configuration than that in the above-described conventional technique.

Figure 3:
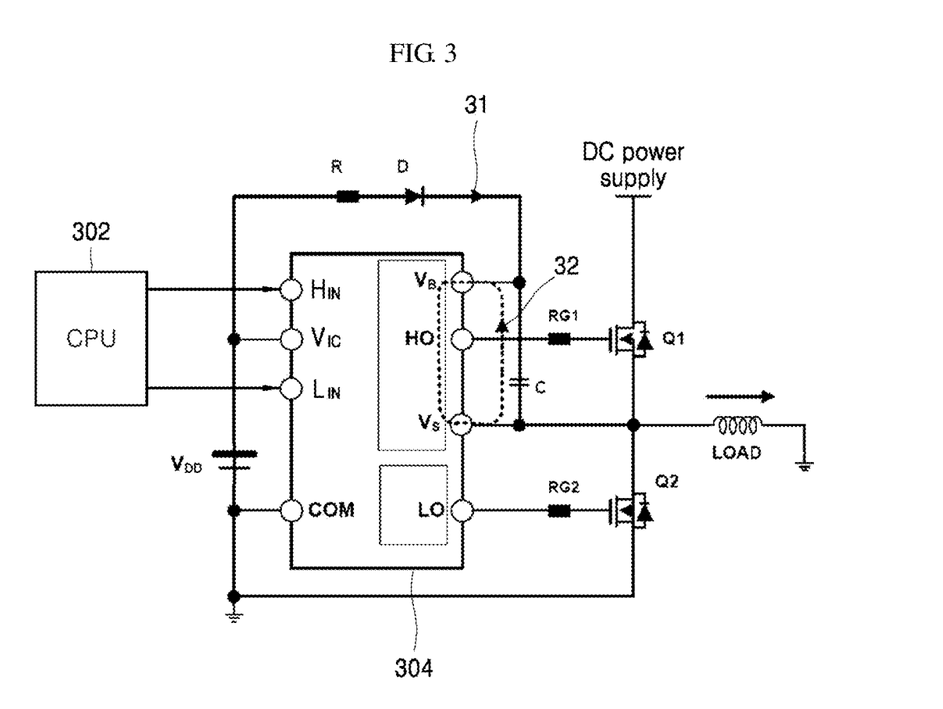
FIG. 3 is a circuit diagram of a gate driver according to a bootstrap topology to according to some embodiments in the present disclosure.

FIG. 3 is a circuit diagram of a gate driver according to a bootstrap topology to which the present disclosure is applied.

A gate driver according to a bootstrap topology shown in FIG. 3 is a circuit capable of driving a switching element (for example, IGBT) included in a three-phase two-level inverter with a single power supply. Referring to FIG. 3, the gate driver includes an IC module 304 for outputting switching signals HO and LO used to control a complementary switching (ON/OFF) operation of switching elements Q1 and Q2 using PWM signals HIN and LIN input from a CPU 302, The gate driver of FIG. 3 is driven with a driver driving voltage $V_{DD}$ supplied by an external power supply. The gate driver uses the driver driving voltage $V_{DD}$ to apply an IC module driving voltage through a power supply terminal $V_{IC}$ and a ground terminal COM of the IC module 304.

This IC module driving voltage is used to drive the switching element Q1 or is used for voltage charging for drive of the switching element Q2. For example, assuming that a current is flown in a direction indicated by a solid arrow 31, a capacitor C is charged at the same time when the switching element Q1 is driven. Thereafter, when a current is flown in a direction indicated by a dotted arrow 32, the switching element Q2 is driven by a voltage with which the capacitor C is charged.

In the meantime, an UV (Under Voltage) detector (not shown) may be included in the IC module 304 of the gate driver. The UV detector prevents damage of the switching elements Q1 and Q2 due to low voltage driving by interrupting an output of the switching signals HO and LO if the IC module driving voltage applied for drive of the IC module 304 falls below a first detection level (for example, 8.6V).

In addition, the UV detector detects the magnitude of a voltage of the PWM signals respectively input to the input terminals HIN and LIN and allows an output of the switching signals HO and LO of the IC module 304 only when the magnitude of the detected PWM signal HIN is equal to or higher than a second detection level (for example, 2.2V) or the magnitude of the detected PWM signal LIN is equal to or lower than a third detection level (for example, 0.8V). The reason for detection of the magnitude of the voltage of the PWM signals HIN and LIN is that it takes a certain time for a CPU driving voltage for drive of the CPU 302 outputting the PWM signals HIN and LIN to arrive at a voltage (for example, 2.6V) for normal drive of the CPU and, accordingly, the magnitude of the voltage of the PWM signals HIN and LIN increases slowly.

Figure 4:
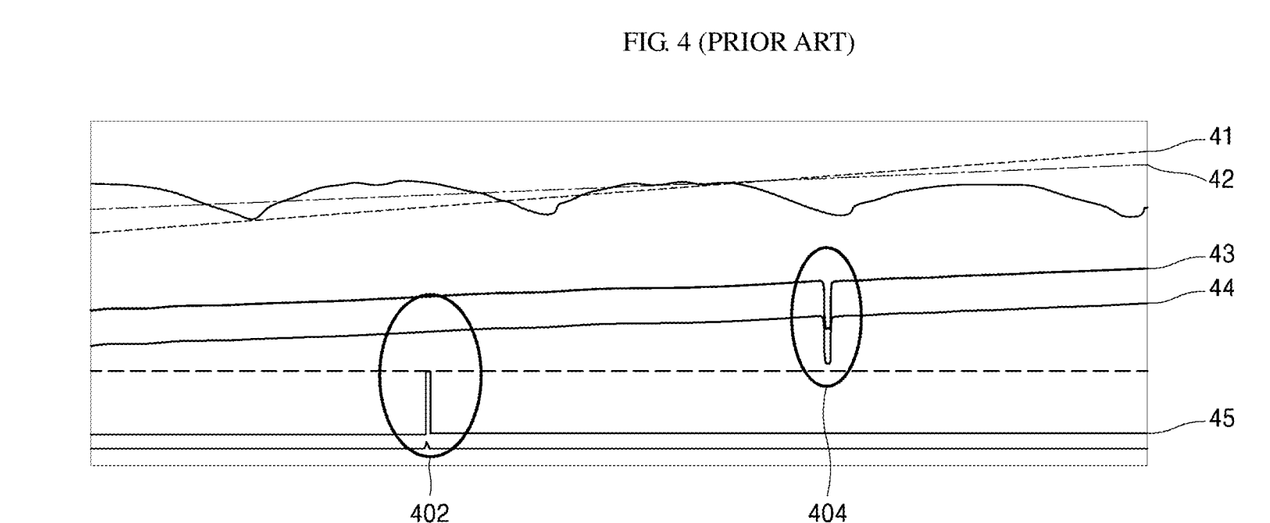
FIG. 4 is a view for explaining malfunction of an IC module which occurs at a reference voltage arrival time of the gate driver according to the conventional technique.

FIG. 4 is a view for explaining malfunction of an IC module which occurs at a reference voltage arrival time of the gate driver according to the conventional technique.

FIG. 4 depicts a CPU driving voltage 41, a driver driving voltage 42, a switching signal (HO) voltage 43, a switching signal (LO) voltage 44 and a switching element (Q2) driving voltage 45.

As described above, when the driver driving voltage $V_{DD}$ is applied to the gate driver for drive of the gate driver, it takes a certain time for the driver driving voltage $V_{DD}$ to arrive at the reference voltage appropriate for drive of the gate driver. However, the UV detector incorporated in the IC module 304 allows an output of the switching signals HO and LO by the IC module 304 if the IC module driving voltage exceeds the first detection level. Even when the magnitude of the IC module driving voltage exceeds the first detection level, it must take a certain time further for the IC module driving voltage to arrive at the first reference voltage (for example, 12V) for full drive of the IC module 304.

However, if the PWM signals HIN and LIN output by the CPU 302 satisfy the second detection level and the third detection level under a state where the magnitude of the IC module driving voltage is between the first detection level and the first reference voltage, the IC module 304 outputs the switching signals HO and LO although the IC module 304 cannot be normally driven. Accordingly, as indicated by a point 402 in FIG. 4, malfunction of the switching element Q2 occurs.

In addition, upon arriving at the CPU driving voltage according to operation characteristics of the CPU 302, there occurs a phenomenon that a peripheral port output of the CPU 302 is reset, and, accordingly, as indicated by a point 404 in FIG. 4, malfunction of the output of the switching signals HO and LO may occur. Such malfunction of the output of the switching signals HO and LO may cause arm-short of the inverter, which may result in deterioration and damage of the switching elements.

In particular, since an inverter protection circuit including an arm-short protection circuit will not work normally for a reference voltage arrival time by which the driver driving voltage arrives at the first reference voltage, there is a high possibility of arm-short and inverter damage.

Figure 5:
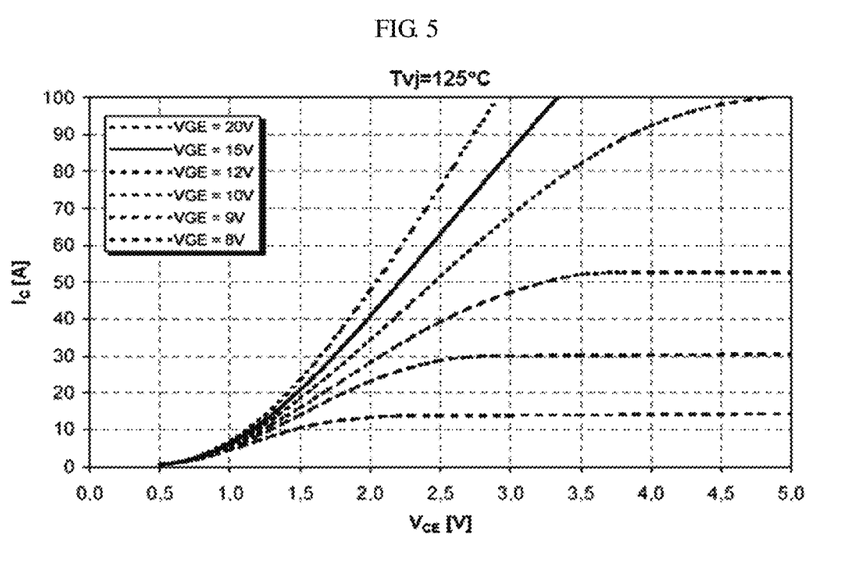
FIG. 5 is a graph showing characteristics of collector current ($I_C$) and collector-emitter voltage ($V_{CE}$) of a switching element used for an inverter.

FIG. 5 is a graph showing characteristics of collector current ($I_C$) and collector-emitter voltage ($V_{CE}$) of a switching element used for an inverter.

For example, if the switching elements Q1 and Q2 shown in FIG. 3 are IGBT elements, for the same collector current, a collector-emitter voltage increases with decrease in a base voltage, which may result in an excessive conduction loss in IGBT driving. In addition, a lower base voltage provides a smaller charging current, which results in increase in a switching loss. Such IGBT losses result in an IGBT loss due to deterioration.

Figure 6:
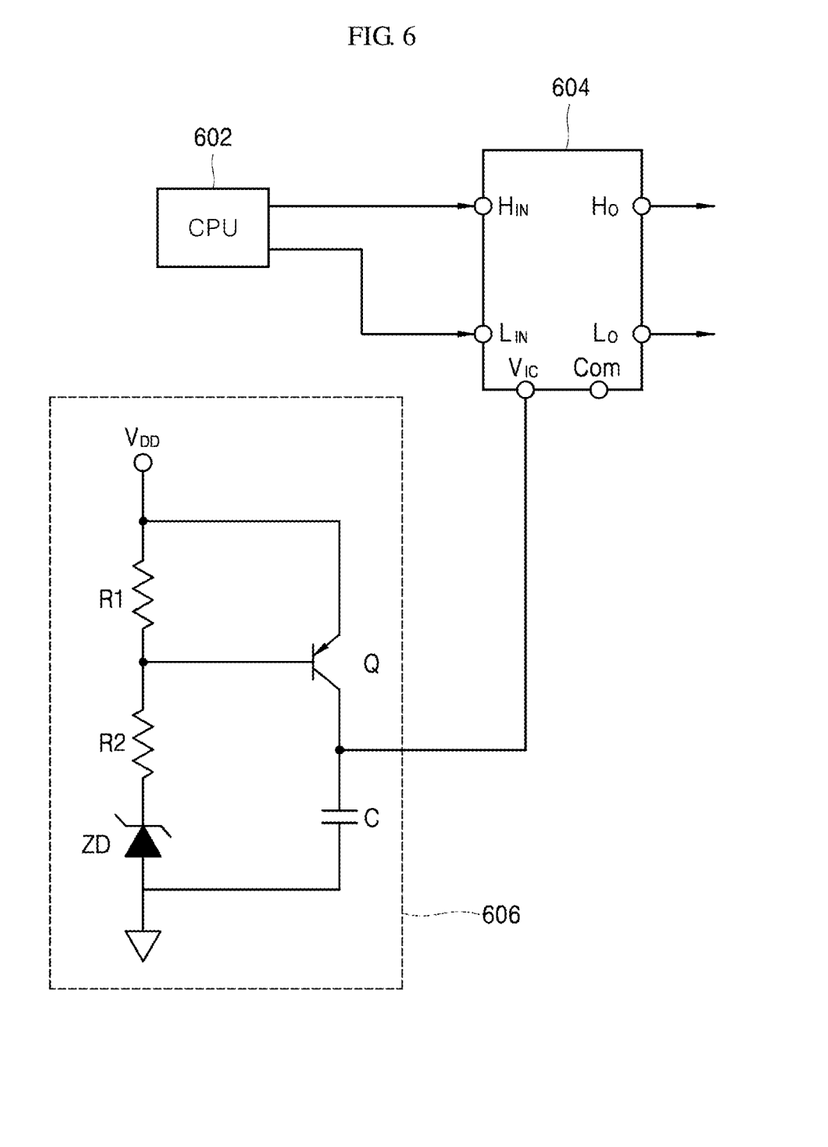
FIG. 6 is a view showing the configuration of a gate driver according to one embodiment of the present disclosure.

FIG. 6 is a view showing the configuration of a gate driver according to one embodiment of the present disclosure.

Referring to FIG. 6, a gate driver according to one embodiment of the present disclosure includes an IC module 604 and a power supply managing part 606.

The IC module 604 uses the PWM signals HIN and LIN input from the outside (for example, the CPU 602) to generate the switching signals HO and LO for a switching operation of a switching element (not shown). Such an IC module 604 is driven by the IC module driving voltage applied through the power supply terminal $V_{IC}$.

The power supply managing part 606 uses the driver driving voltage for drive of the gate driver, which is applied from the outside, to determine whether to apply the IC module driving voltage. In one embodiment of the present disclosure, the power supply managing part 606 uses the driver driving voltage to apply the IC module driving voltage for drive of the IC module 604 to the IC module 604 when the driver driving voltage is equal to or higher than the first reference voltage, and stops the application of the IC module driving voltage when the driver driving voltage is equal to or lower than the second reference voltage.

Referring to FIG. 6, the power supply managing part 606 includes an input terminal $V_{DD}$ to which the driver driving voltage is applied, and a ground terminal ∇. In addition, the power supply managing part 606 further includes an output terminal $V_{out}$ through which the IC module driving voltage for drive of the IC module 604 is output.

A first resistor R1, a second resistor R2 and a Zener diode ZD are connected in series between the input terminal $V_{DD}$ and the ground terminal ∇. In addition, the power supply managing part 606 further includes a switching element Q having an emitter terminal connected to the input terminal $V_{DD}$, a collector terminal connected to the output terminal $V_{out}$, and a base terminal connected to a node between the first resistor R1 and the second resistor R2.

In addition, in order to prevent the IC module from being damaged due to a ripple current, a capacitor C may be interposed between the output terminal $V_{out}$ and the Zener diode ZD.

The power supply managing part 606 constructed as above applies the IC module driving voltage to the power supply terminal $V_{IC}$ of the IC module 604 via the output terminal $V_{out}$ by turning on the switching element Q when the driver driving voltage input through the input terminal $V_{DD}$ is equal to or higher than the first reference voltage. In addition, the power supply managing part 606 stops the application of the IC module driving voltage to the IC module 604 via the output terminal $V_{out}$ by turning off the switching element Q when the driver driving voltage input through the input terminal $V_{DD}$ is equal to or lower than the second reference voltage. At this time, the first reference voltage at which the switching element Q1 is turned on and the second reference voltage at which the switching element Q1 is turned off may be differently set depending on the resistances of the first and second resistors R1 and R2 and the magnitude of a threshold voltage of the Zener diode ZD. In addition, the first reference voltage and the second reference voltage may be set to be equal to each other or different from each other.

The switching element Q remains turned off until a voltage of a certain magnitude is formed after an initial voltage is applied to the power supply managing part 606 through the input terminal $V_{DD}$. Accordingly, no power is supplied to the IC module 604. Thereafter, when the voltage input through the input terminal $V_{DD}$ has the certain of magnitude or larger, the switching element Q is turned on and power is accordingly supplied to the power supply managing part 606.

Figure 7:
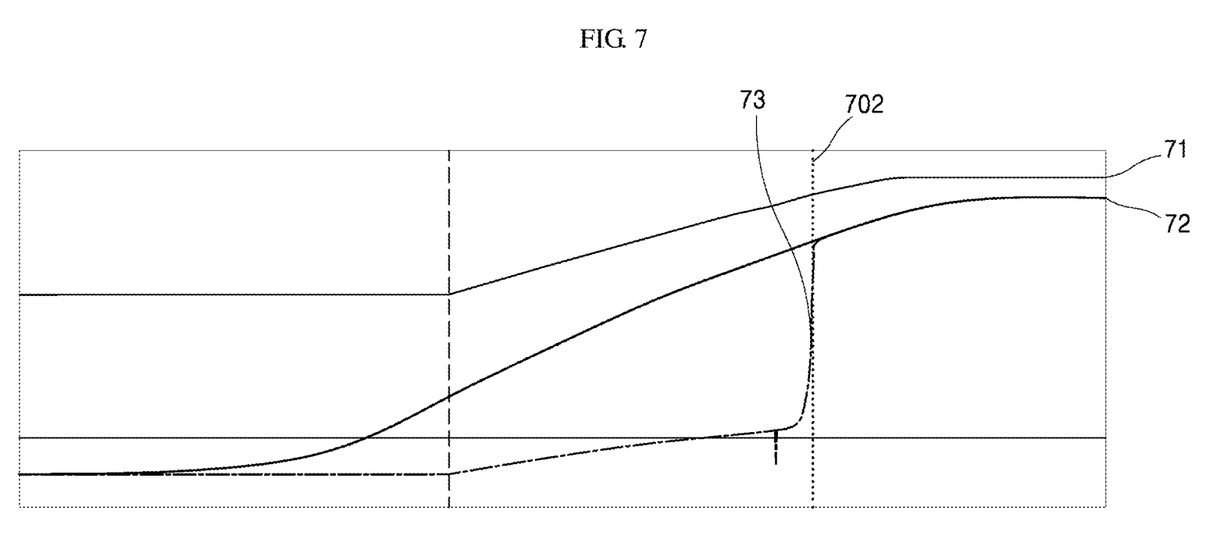
FIG. 7 shows waveforms of a driver driving voltage and an IC module driving voltage until the driver driving voltage of the gate driver according to one embodiment of the present disclosure arrives at a first reference voltage.

FIG. 7 shows waveforms of the driver driving voltage and the IC module driving voltage until the driver driving voltage of the gate driver according to one embodiment of the present disclosure arrives at the first reference voltage.

As shown in FIG. 7, as the driver driving voltage 72 of the gate driver begins to be applied, the magnitude of the driver driving voltage 72 slowly increases and the CPU driving voltage 71 input through a separate power supply also increases. At this time, the IC module driving voltage 73 is not applied until the driver driving voltage 72 arrives at the first reference voltage 702, and begins to be applied from the point of time when the driver driving voltage 72 arrives at the first reference voltage 702.

Thus, by interrupting the application of the IC module driving voltage 73 until the driver driving voltage 72 arrives at the first reference voltage 702, it is possible to prevent the incomplete operation of the IC module 604 and the malfunction and damage of the switching element, which have been described with reference to FIG. 4.

Figure 8:
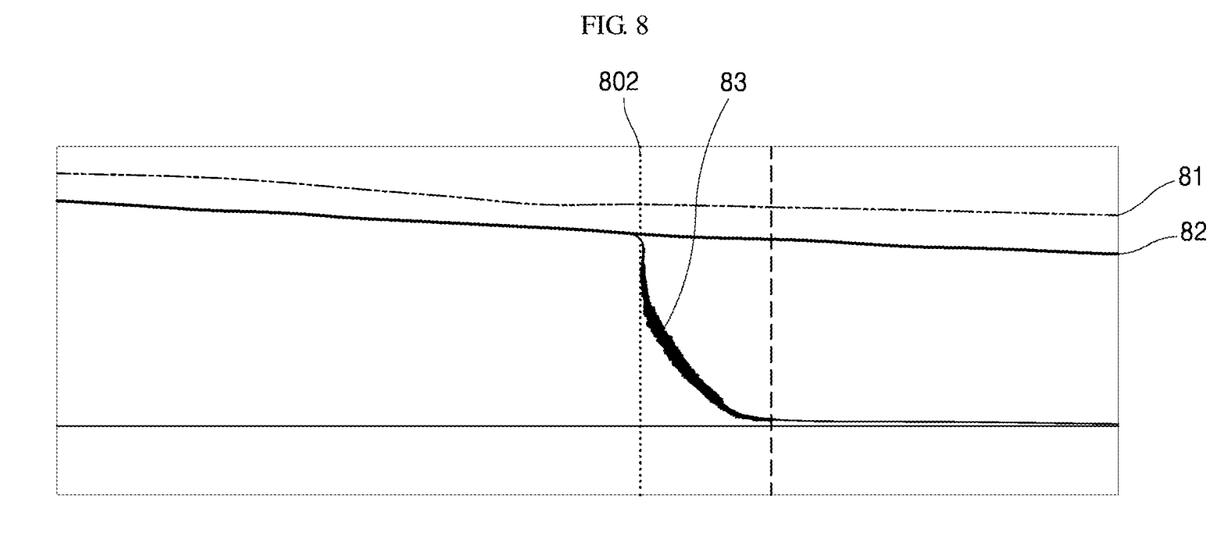
FIG. 8 shows waveforms of a driver driving voltage and an IC module driving voltage when the driver driving voltage of the gate driver according to one embodiment of the present disclosure falls below a second reference voltage.

FIG. 8 shows waveforms of the driver driving voltage and the IC module driving voltage when the driver driving voltage of the gate driver according to one embodiment of the present disclosure falls below the second reference voltage.

If the driver driving voltage 82 falls below the second reference voltage 802 while the gate driver is being normally driven, the application of the IC module driving voltage 83 is stopped as shown in FIG. 8. At this time, the CPU driving voltage 81 remains unchanged irrespective of the IC module driving voltage 83.

As described above, as the driver driving voltage of the gate driver becomes lower, the conduction loss and switching loss of the switching element increase and the switching element may be damaged due to deterioration. Therefore, when the gate driver is driven, the driver driving voltage has to be maintained at the second reference voltage or larger. In the present disclosure, if the driver driving voltage falls below the second reference voltage (for example, 13.09V), malfunction and damage of the switching element are prevented by interrupting the IC module driving voltage, as shown in FIG. 8.

While the present disclosure has been particularly shown and described with reference to embodiments thereof, it will be understood by those skilled in the art that various changes in form and details may be made therein without departing from the spirit and scope of the present disclosure. The embodiments are provided for the purpose of illustrating the disclosure, not in a limitative sense. Thus, it is intended that the present disclosure covers the modifications and variations of this disclosure provided they come within the scope of the appended claims and their equivalents.

What is claimed is:

1. A gate driver for generating a switching signal used to control a switching operation of an inverter, comprising:
   an IC module configured to generate the switching signal by using a PWM signal input from the outside; and
   a power supply managing part configured to apply an IC module driving voltage for drive of the IC module by using a switching element and a driver driving voltage for drive of the gate driver if the driver driving voltage is equal to or larger than a first reference voltage, and is further configured to stop the application of the IC module driving voltage if the driver driving voltage is equal to or lower than a second reference voltage,
   wherein the power supply managing part includes:
   an input terminal to which the driver driving voltage is applied;
   a ground terminal;
   an output terminal through which the IC module driving voltage is output;
   a first resistor;
   a second resisto;
   a Zener diode, wherein the first resistor, the second resistor and the Zener diode are connected in series between the input terminal and the ground terminal;
   a switching element having an emitter terminal connected to the input terminal, a collector terminal connected to the output terminal, and a base terminal connected to a node between the first resistor and the second resistor; and
   a capacitor interposed between the output terminal and the Zener diode.

2. The gate driver according to claim 1, wherein the switching element is turned on if the driver driving voltage applied through the input terminal is equal to or larger than the first reference voltage.

3. The gate driver according to claim 1, wherein the switching element is turned off if the driver driving voltage applied through the input terminal is equal to or lower than the second reference voltage.

* * * * *